(12) United States Patent
Aritsuka et al.

(10) Patent No.: US 8,543,352 B2
(45) Date of Patent: Sep. 24, 2013

(54) SYSTEM FOR MEASURING A SHAPE, METHOD FOR MEASURING A SHAPE, AND COMPUTER PROGRAM PRODUCT

(75) Inventors: Yuki Aritsuka, Toshima-Ku (JP); Morihisa Hoga, Nishitokyo (JP)

(73) Assignee: Dai Nippon Printing Co., Ltd., Shinjuku-Ku (JP)

( * ) Notice: Subject to any disclaimer, the term of this patent is extended or adjusted under 35 U.S.C. 154(b) by 403 days.

(21) Appl. No.: 12/600,527

(22) PCT Filed: Apr. 2, 2008

(86) PCT No.: PCT/JP2008/056564
§ 371 (c)(1),
(2), (4) Date: Nov. 17, 2009

(87) PCT Pub. No.: WO2008/142916
PCT Pub. Date: Nov. 27, 2008

(65) Prior Publication Data
US 2010/0169042 A1 Jul. 1, 2010

(30) Foreign Application Priority Data
May 22, 2007 (JP) ................................. 2007-135633

(51) Int. Cl.
G01B 3/46 (2006.01)
G01B 3/04 (2006.01)
G01B 3/20 (2006.01)
H04B 17/00 (2006.01)

(52) U.S. Cl.
USPC ............ 702/167; 702/150; 702/155; 702/190

(58) Field of Classification Search
USPC .................. 702/95, 104, 150, 155, 167, 190; 235/454; 356/610; 433/18
See application file for complete search history.

(56) References Cited

U.S. PATENT DOCUMENTS

| 7,186,115 B2 * | 3/2007 | Goldberg et al. ............... 433/18 |
| 7,240,839 B2 * | 7/2007 | Jung et al. ..................... 235/454 |

(Continued)

FOREIGN PATENT DOCUMENTS

| JP | 04-133061 A1 | 5/1992 |
| JP | 07-043173 A1 | 2/1995 |

(Continued)

OTHER PUBLICATIONS

Jin Choi et al., "Distortion and Overlay Performance of UV Step and Repeat Imprint Lithography," MNE Micro- and Nano-Engineering Conference, Sep. 2004.

(Continued)

Primary Examiner — Marc Armand
Assistant Examiner — Felix Suarez
(74) Attorney, Agent, or Firm — Burr & Brown

(57) ABSTRACT

A system for measuring a shape, includes an external storage unit storing tolerances of first and second shape factors defining a design shape of a measuring object; a first measuring tool measuring the first shape factor of the measuring object to obtain measurement data; and a measurement processing unit determining a shape of the measuring object. The measurement processing unit includes; a comparison module comparing the measurement data of the first shape factor with the tolerance of the first shape factor; a verification module composing a predicted shape using the measurement data and verifying whether the predicted shape is formed as a figure; a calculation module calculating predicted data of the second shape factor from the predicted shape; and a determination module determining a measurement shape by comparing the predicted data with the tolerance of the second shape factor.

22 Claims, 10 Drawing Sheets

(56) References Cited

U.S. PATENT DOCUMENTS

| 7,323,130 | B2 | 1/2008 | Nimmakayala et al. | |
|---|---|---|---|---|
| 7,751,066 | B2 * | 7/2010 | Iwasaki | 356/610 |

FOREIGN PATENT DOCUMENTS

| JP | 11-023253 | A1 | 1/1999 |
|---|---|---|---|
| JP | 2000-131051 | A1 | 5/2000 |
| JP | 2002-031511 | A1 | 1/2002 |
| JP | 2006-510223 | A1 | 3/2006 |
| WO | 2007/037032 | A1 | 4/2007 |

OTHER PUBLICATIONS

Japanese Office Action dated Jan. 31, 2012 (with English translation).

* cited by examiner

SYSTEM FOR MEASURING A SHAPE, METHOD FOR MEASURING A SHAPE, AND COMPUTER PROGRAM PRODUCT

BACKGROUND OF THE INVENTION

1. Field of the Invention

The present invention relates to a measurement system of a three-dimensional shape of an optical component and the like, a measuring method thereof, and a computer program product.

2. Description of Related Art

In manufacture of a micro electrical machine system (MEMS) apparatus, a semiconductor device and the like, a pattern of an exposure mask or an imprint mold is transferred onto a substrate to be processed using a lithography process, such as a photolithography, an imprint lithograph, and the like. In association with miniaturization of the transferred pattern, a shape of the exposure mask or the imprint mold has an influence on accuracy of position or dimension of the transferred pattern. In order to control the shape of the exposure mask or the imprint mold, a shape measurement may be required.

For example, in a transmission exposure mask, a flatness of a surface of the exposure mask, on which the mask pattern is formed, is usually the most critical item, and a strict specification is defined. With regard to measurement of the flatness of the exposure mask, various efforts are carried out (refer to JP-A Hei4-133061 (KOKAI)). Shape factors, such as a dimension and the like, except the flatness, may be relatively less important, and may not measure with high accuracy. Also, for measurement values of the shape obtained from a plurality of measuring methods, consistency between the respective measurement values of the shape is not considered.

However, in association with improvement of optical systems of exposure tools, an outer shape, especially, a position relation between surfaces is required to strictly define. For example, in an exposure mask for extreme ultraviolet (EUV) light, the strict specification must be defined not only for the flatness of the surface, on which the mask pattern is formed, but also for the other shape factors.

In the EUV exposure, a reflection optical system is used. In this case, the exposure mask is supported by fixing a bottom surface of the exposure mask on a mask stage. Therefore, when a parallelism between top and bottom surfaces of the exposure mask is large, it is difficult to achieve the intended reflection angle for an exposure light. Thus, it is necessary to strictly define the parallelism between the top surface and the bottom surface of the exposure mask. Moreover, since there is a requirement to precisely identify the position of the mask pattern to a mask substrate of the exposure mask, accuracy of the outside dimensions of the mask substrate may be also required.

In the imprint lithography, the imprint mold is pressed into a transfer film, and then a minute concave and convex pattern formed on the surface of the imprint mold is transferred. As a method for carrying out a distortion correction for the transferred pattern, a method, which carries out the correction by applying an external force to the imprint mold and consequently generating minute deformation, is proposed (refer to JP-A 2006-510223(KOKAI), and J. Choi et al., MNE Micro- and Nano-Engineering Conference, 2004, September).

In order to achieve the foregoing distortion compensation in the imprint lithography, the imprint mold must be manufactured to have the ideal rectangular parallelepiped defined in the specification. Unless the imprint mold has the outer shape defined in the specification, it is difficult to deform the imprint mold to the intended shape by using the external force, and a result obtained by transfer cannot be desirable.

In the usual shape measurement, for example, dimensions, angles, flatness and the like are individually measured by respective measurement systems differing from each other. For this reason, when the respective measurement values are substituted to simulate the shape, there might be no consistency between the respective measurement values so that a figure is not geometrically formed. Also, when the specification of the shape is close to limits of the measurement accuracy of the measurement systems, a range of error of each measurement value increases. As a result, since calculated values by simulation of the shape may have a wide range, the simulation result may have lower reliability. Also, since a calculation amount is increased, a measuring time may be increased, and productivity of the imprint mold or the exposure mask may be decreased.

SUMMARY OF THE INVENTION

An object of the present invention is to provide a measurement system, a measurement method and a program, capable of measuring a shape with a high accuracy and a high reliability.

A first aspect of the present invention inheres in a system for measuring a shape, including: an external storage unit configured to store tolerances of first and second shape factors, the first and second shape factors defining a design shape of a measuring object; a first measuring tool configured to measure the first shape factor of the measuring object and to obtain measurement data; and a measurement processing unit configured to determine a shape of the measuring object, the measurement processing unit includes; a comparison module configured to compare the measurement data of the first shape factor with the tolerance of the first shape factor stored in the external storage unit; a verification module configured to compose a predicted shape using the measurement data and to verify whether the predicted shape is formed as a figure; a calculation module configured to calculate predicted data of the second shape factor from the predicted shape composed by the verification module; and a determination module configured to determine a measurement shape by comparing the predicted data calculated by the calculation module with the tolerance of the second shape factor stored in the external storage unit.

A second aspect of the present invention inheres in a computer implemented method for measuring a shape, including: obtaining first measurement data of a first shape factor measured from a measuring object by a first measuring tool, the first shape factor defining a design shape of the measuring object; comparing the first measurement data with a tolerance of the first shape factor; verifying whether a first predicted shape is formed as a figure when the first measurement data is within a range of the tolerance of the first shape factor, the first predicted shape composed using the first measurement data; calculating first predicted data of a second shape factor from the first predicted shape when the first predicted shape is formed as a figure, the second shape factor differing from the first shape factor; and determining the first predicted shape as a first measurement shape when the first predicted data is within a range of a tolerance of the second shape factor.

A third aspect of the present invention inheres in a computer program stored on a computer-readable medium of a computer and configured to be executed by a computer for measuring a shape, including: instructions configured to measure a first shape factor defining a design shape of a measuring object; instructions configured to obtain first measurement data of the measured first shape factor; instructions configured to verify whether a first predicted shape is formed as a figure when the first measurement data is within a range of a tolerance of the first shape factor, the first predicted shape composed using the first measurement data; instructions configured to calculate first predicted data of a second shape factor from the first predicted shape when the first predicted shape is formed as a figure, the second shape factor differing from the first shape factor; and instructions configured to determine the first predicted shape as a measurement shape when the first predicted data is within a range of a tolerance of the second shape factor.

DETAILED DESCRIPTION OF THE INVENTION

Figure 1:
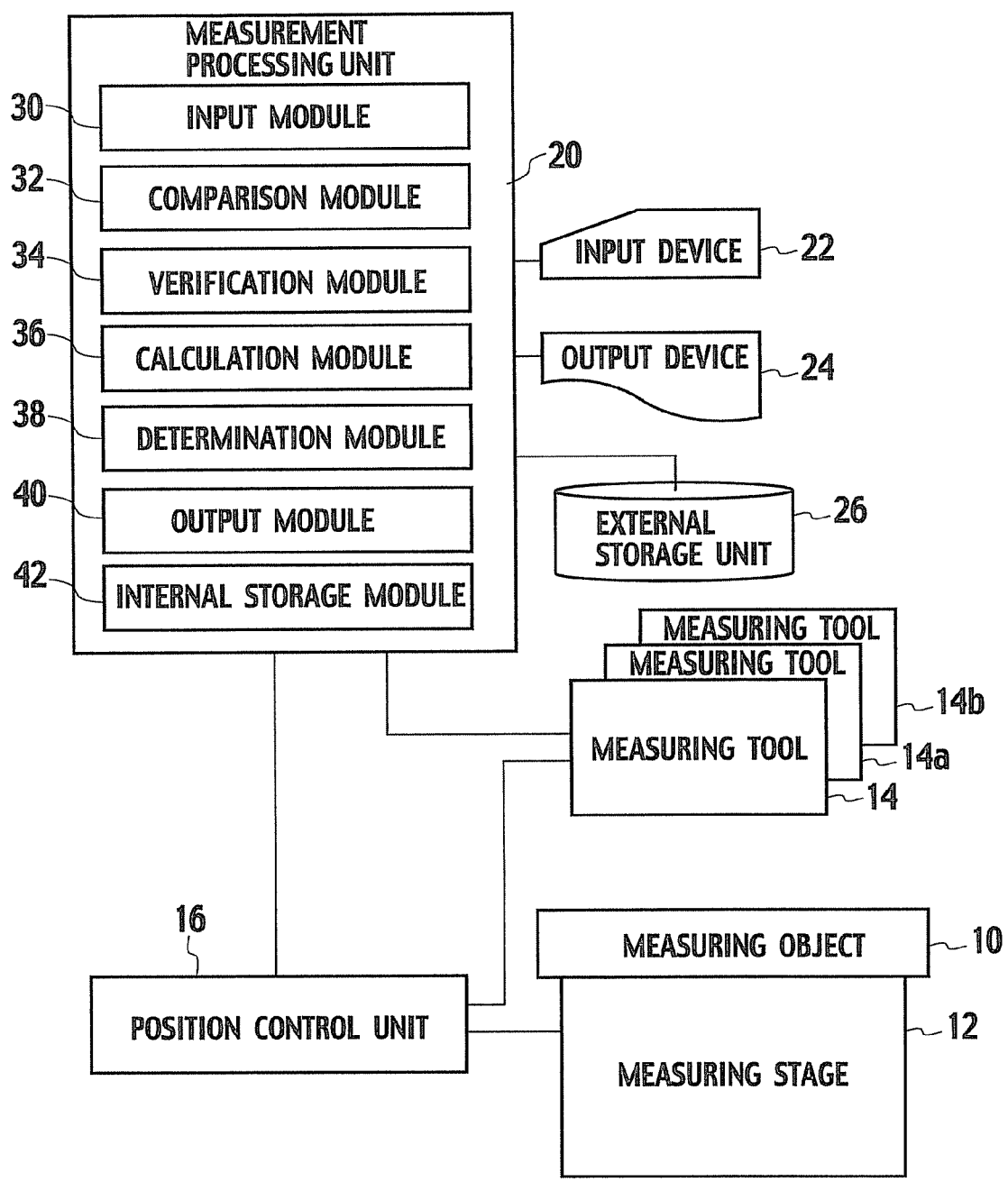
FIG. 1 is a schematic view showing an example of a measurement system according to an embodiment of the present invention.

Various embodiments of the present invention will be described with reference to the accompanying drawings. It is to be noted that the same or similar reference numerals are applied to the same or similar parts and elements throughout the drawings, and the description of the same or similar parts and elements will be omitted or simplified.

A measurement system according to an embodiment of the present invention includes a measuring stage 12, measuring tools 14, 14a, 14b, a position control unit 16, a measurement processing unit 20, an input device 22, an output device 24, an external storage unit 26, and the like, as shown in FIG. 1. Also, the measurement processing unit 20 includes an input module 30, a comparison module 32, a verification module 34, a calculation module 36, a determination module 38, an output module 40, an internal storage module 42, and the like. A measuring object 10 is supported on a surface of the measuring stage 12. The position control unit 16 controls positions of the measuring stage 12 and the measuring tools 14, 14a, 14b. The measuring tools 14, 14a, 14b, the position control unit 16, the input device 22, the output device 24 and the external storage unit 26 are connected to the measurement processing unit 20.

In the measurement system according to the embodiment of the present invention, one of a shape factor which can compose a shape of the measuring object 10, and a shape factor to which strict processing accuracy is required, is defined as a "first shape factor". A shape factor that is calculated from a figure composed by using the first shape factor is defined as a "second shape factor".

For the first shape factor, a dimension, an angle, flatness and the like may be adopted. When measuring the outer shape with a high accuracy, it is desirable to adopt a dimension of a side for the first shape factor. When adopting the dimension for the first shape factor, an angle, flatness, parallelism and the like may be adopted for the second shape factors. Hereinafter, the description will be given using the dimension for the first shape factor, and the angle and the flatness for the second shape factors.

The measurement processing unit 20 obtains first measurement data of the first shape factor that defines a design shape of the measuring object 10. When the first measurement data is within a range of tolerance of the first shape factor by comparing the first measurement data with the tolerance of the first shape factor, it is verified whether a figure can be formed by composing a first predicted shape using the first measurement data. If the first predicted shape is formed as the figure, first predicted data of the second shape factors, which differs from the first shape factor, is calculated from the first predicted shape. If the first predicted data is within a range of the specification, the determination module 38 determines that the first predicted shape is the measurement shape.

Figure 2:
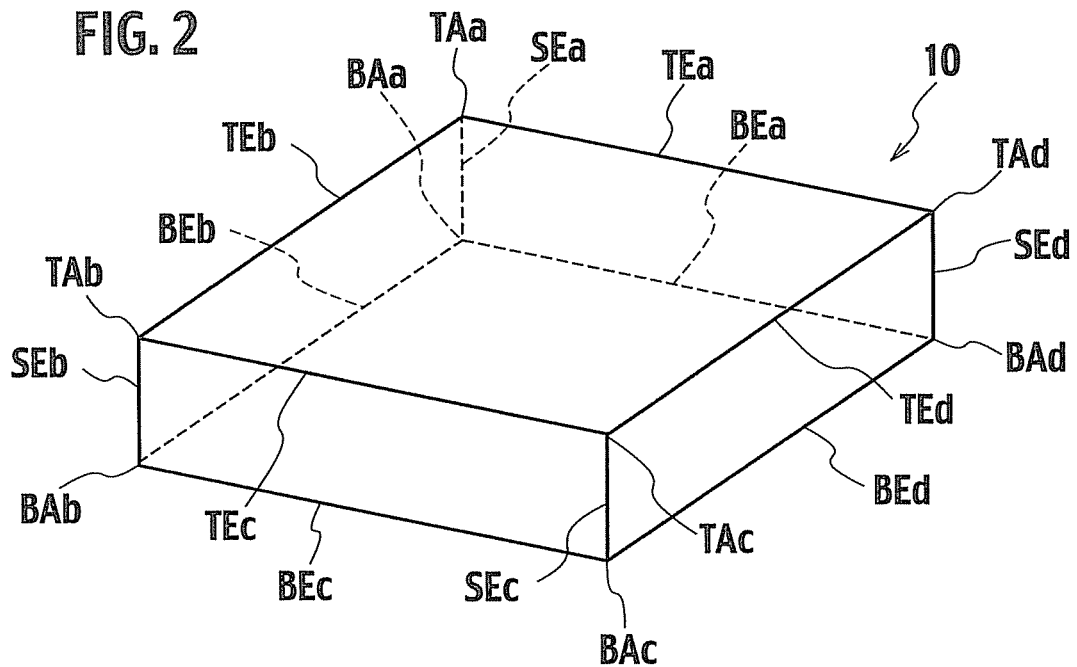
FIG. 2 is a perspective view showing an example of a measuring object according to the embodiment of the present invention.

The measuring object 10 is an optical component, such as the imprint mold, the exposure mask and the like, for example, or a unprocessed substrate for the optical components. As shown in FIG. 2, the shape of the measuring object 10 is a rectangular parallelepiped. In order to determine the outer appearance shape of the measuring object 10, the dimension, it is necessary to measure dimensions, angles and the like. Additionally, for a surface on which a pattern of the imprint mold or the exposure mask will be formed, the measurement of flatness is also required.

In the case of the optical imprint lithography, for the measuring object 10, a transparent material, such as quartz glass, heat resisting glass, calcium fluoride ($CaF_2$), and magnesium fluoride ($MgF_2$), having a thickness, for example, of about 6 mm to 7 mm, and a laminated structure composed of the transparent materials, may be used. In the case of the thermal imprint lithography, for the measuring object 10, silicon carbide (SiC), Si, SiC/Si, silicon oxide ($SiO_2$)/Si, and silicon nitride ($Si_3N_4$)/Si and the like may be used. Also, a metallic substrate, such as tantalum (Ta), aluminum (Al), titanium (Ti), and tungsten (W) may be used.

In the case of the photolithography, for the measuring object 10, quartz glass, $CaF_2$, sapphire, and the like may be used. Also, in the EUV exposure, ultra low thermal expansion glass and the like may be used.

A top surface of the measuring object 10 is defined by sides TEa, TEb, TEc and Ted, and angles of apexes TAa, TAb, TAc and TAd at which the respective sides intersect. A bottom surface is defined by sides BEa, BEb, BEc and Bed, and angles of apexes BAa, BAb, BAc and BAd at which the respective sides intersect. Also, four side surfaces are defined by the sides of the top surface and the sides of the bottom surface opposite thereto, and sides SEa, SEb, SEc and SEd, respectively.

Figure 3:
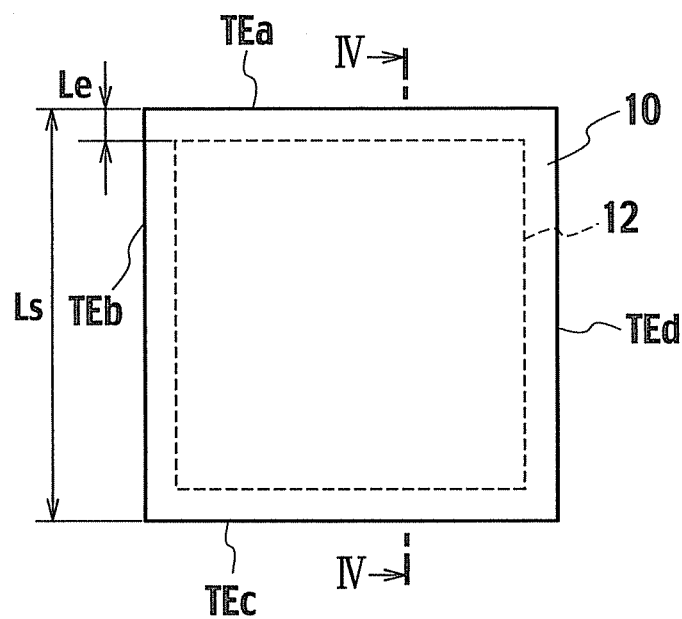
FIG. 3 is a plan view showing an example of a measuring stage supporting the measuring object according to the embodiment of the present invention.
Figure 4:
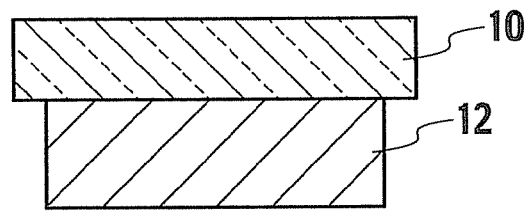
FIG. 4 is a cross sectional view taken on line IV-IV of the measuring stage shown in FIG. 1.

As shown in FIGS. 3 and 4, the measuring object 10 is placed on a surface of the measuring stage 12. On the measuring stage 12, measurement is implemented by using a plurality of measuring tools 14, 14a, 14b. In order to enable the measurement of not only the top surface but also the side surface and the bottom surface, the surface area of the measuring stage 12 is placed medially in the peripheral edge of the bottom surface of the supported measuring object 10.

For example, when using a length Ls of the longest side of the bottom surface as a reference, a width Le of the peripheral area where the measuring object 10 is not supported is desirably about 1.5% or more and about 20% or less of the length Ls. When the width Le is less than 1.5% of the length Ls, it is impossible to ensure an area used for the angle measurement between the bottom surface and the surfaces intersecting the bottom surface. Also, when the width Le exceeds 20% of the length Ls, deformation caused by holding the measuring object 10 is increased, and measurement error cannot be ignored.

The measuring tools 14, 14a, 14b measure the shape factors of the measuring object 10. As the shape factor, a component part of the figure, such as the side, the angle, the apex and the like, and a geometric quantity, such as the angle, a straightness, the flatness, the parallelism, a true position and the like, are included. For the measuring tools 14, 14a, 14b, optical measuring tools capable of measuring the dimension, the angle, the flatness and the like may be used. Also, a stylus measuring tool may be used to measure the dimension, the flatness and the like. In the following description, for convenience of explanation, the measuring tools 14, 14a, 14b are assumed to be the measuring tools for the dimension, the angle and the flatness, respectively.

The position control unit 16 controls positions of the measuring stage 12 and the measuring tools 14, 14a, 14b and obtains coordinate data including plane coordinates and heights. The coordinate data is transmitted to the measuring tools 14, 14a, 14b.

The input module 30 of the measurement processing unit 20 obtains measurement data of the shape factors from the measuring tools 14, 14a, 14b. The measurement data are, for example, the dimension of each side, the angle of each apex, the flatness of each surface, and the like of the measuring object 10.

The comparison module 32 obtains tolerance of the shape of the measuring object 10, which is stored in the external storage unit 26, and compares the tolerance of each shape factor and the measurement data. If the measurement data is not within the range of the tolerance, the re-measurement, determination of defective shape, or check of the measuring tool and the like is instructed. For example, if the comparison of the measurement data is for the first time, the re-measurement is instructed. If the comparison of the measurement data is for the second time, the measuring tool is checked. If the measuring tool is normal, the corresponding measuring object is determined to be defective. As the tolerance of the shape, for example, the tolerance defined in the specification of the design shape may be used.

The verification module 34 composes a predicted shape using the measurement data of the first shape factor. It is verified whether the composed predicted shape is normally formed. If the predicted shape is not normal, determination of defective shape or check of the measuring tool is instructed. When the first and second shape factors are obtained, the measurement data of the first and second shape factors are used to verify the figure similarly as mentioned above.

The calculation module 36 calculates the other shape factors from the predicted shape. For example, the straightness of each side and the angle of each apex are calculated as the second shape factors from the dimension measurement data of the first shape factor. Also, the flatness and parallelism of each surface constituting the apex are calculated as the other second shape factors (predicted shape factors) from the angle measurement data of the second shape factor. Also, the parallelism of each measurement target surface is calculated as the predicted shape factor from the flatness measurement data of the second shape factor.

The determination module 38 determines whether the other calculated shape factor is within the range of the tolerance of the shape factor. If the other shape factor is not within the range of the tolerance, a flag indicating that the corresponding shape factor is outside the range of the specification is set. In accordance with the set flag, it is possible to rate as a product.

The output module 40 reads out the measurement processing result of the measuring object to the output device 24. The internal storage module 42 temporarily stores data obtained during a calculation and an analysis thereof during the operation of the measurement processing unit 20.

The input device 22 refers to devices, such as a keyboard, a mouse and the like. When an input operation is performed from the input device 22, corresponding key information is transmitted to the measurement processing unit 20. The output device 24 refers to a screen monitor, such as a liquid crystal display (LCD), a light emitting diode (LED) panel, an electroluminescence (EL) panel and the like. The output device 24 displays shapes verified by the measurement processing unit 20, calculated shape factors, determined results and the like. The external storage unit 26 stores tolerance of the shape defined in the specification of the design shape of the measuring object 10. Also, the external storage unit 26 stores a program for allowing the measurement processing unit 20 to implement comparison between the obtained measurement data and the specification, verification of a shape, calculation of shape factors, and determination of shape factors, and the like.

Figure 5:
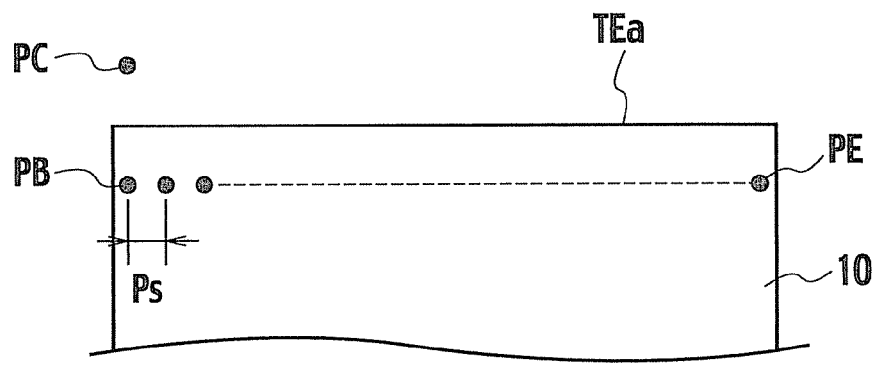
FIGS. 5 to 9 are schematic views showing an example of a method of a dimensional measurement according to the embodiment of the present invention.

In the dimension measurement of the sides of the measuring object 10, an optical stylus may be used. As shown in FIG. 5, points PB, PE are assigned at both ends of the side TEa of the measuring object 10, for example. A point PC is assigned to the opposite side of the point PB with respect to the side TEa. A width between the points PB, PC is Ws (see FIG. 6). Also, a shift pitch Ps of the measuring stage 12 between the points PB, PE is defined.

Figure 6:
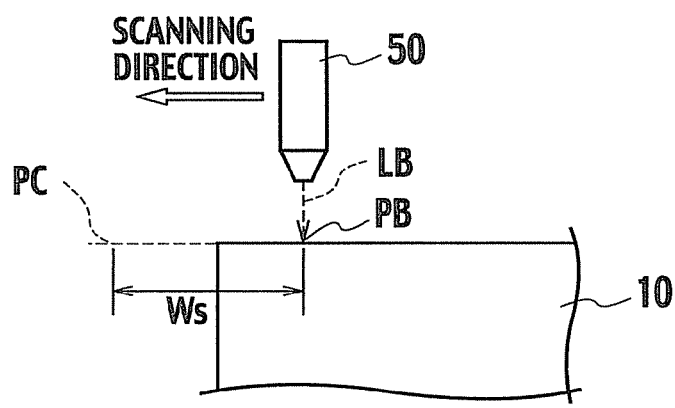
Figure 7:
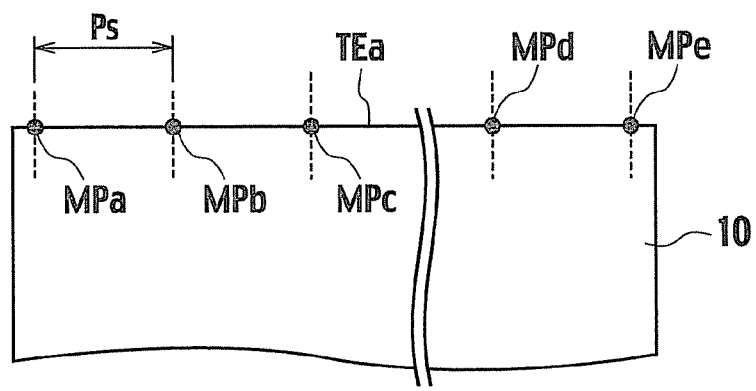

As shown in FIG. 6, a stylus 50 of a dimension measuring tool emits a laser light LB to the surface of the measuring object 10, and a reflection light is detected by a detector (not shown). In scanning to a direction to the point PC from the point PB, when the stylus 50 exceeds the side TEa to deviate from the measuring object 10, reflection of the laser light LB is not detected by the detector of the dimension measuring tool. A boundary where the reflection light is not detected is assigned as a data point, and position coordinate data of each data point is obtained. Similarly, it is repeated with the shift pitch Ps from the point PB to the point PE (see FIG. 6). As a result, as shown in FIG. 7, position coordinates MPa, MPb, MPc, . . . , MPd, MPe are obtained with the shift pitch Ps on the side TEa.

Figure 8:
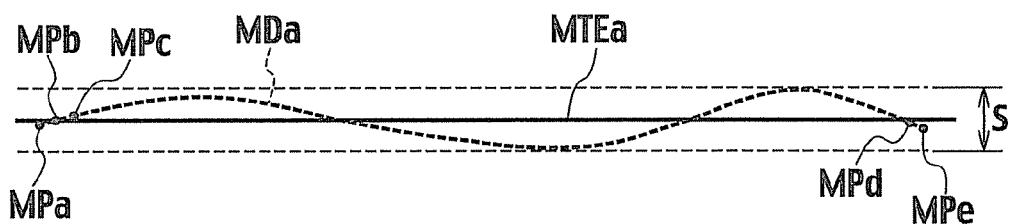
Figure 9:
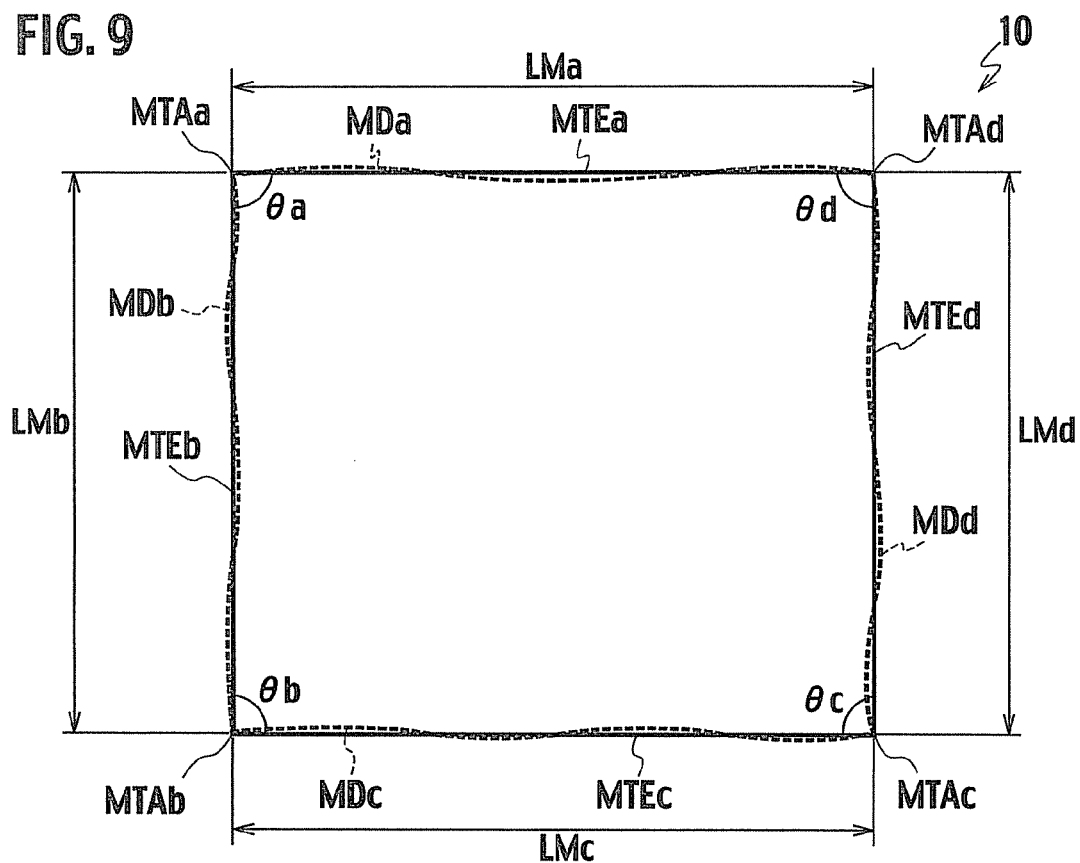

As shown in FIG. 8, with regard to position data MDa including the position coordinates MPa, MPb, MPc, . . . , MPd, MPe, a straight line is calculated by least squares method and the like to obtain measurement data MTEa of the side TEa. Similar measurement is implemented to the position data MDb, MDc and MDd of the other sides TEb, TEc and TEd of the surface of the measuring object 10. As a result, as shown in FIG. 9, the measurement data MTEa, MTEb, MTEc and MTEd of the respective sides are obtained.

When the dimension of the side is assigned to the first shape factor, as shown in FIG. 8, a range of the variation in the position data MDa may be obtained as straightness S for the second shape factor. Only concave portions of concavity and convexity of the side surface (TEa, SEa, BEa and SEd) defined by the sides TEa, SEa, BEa and SEd shown in FIG. 2 are reflected in the straightness S of the position data MDa. Thus, the straightness provides the rough standard of the minimum value of the flatness.

Moreover, when respective points at which the measurement data MTEa, MTEb, MTEc and MTEd of the respective sides intersect are assigned to apexes MTAa, MTAb, MTAc and MTAd, each angle $\theta ab$, $\theta bc$, $\theta cd$ and $\theta da$ of the apexes MTAa, MTAb, MTAc and MTAd may be obtained as the other second shape factor by calculation. The angle calculated as the second shape factor is an intersection angle between the sides approximated to straight lines. Actually, edge portion at which the surfaces intersect is rounded by processing of the rectangular parallelepiped. Thus, the intersection angle between the sides calculated as the second shape factor provides the rough standard of the minimum value of the angle where the surfaces intersect.

In addition, a measuring tool, such as a charge coupled device (CCD) camera and the like, for detecting an outer shape by image recognition may be used for the dimension measurement. For example, an image of the surface of the measuring object 10 is obtained by the CCD camera. When the image including the entire length of the side cannot be obtained in one shot, after obtaining divided images, the divided images are composed on a computer. By analyzing the image using the computer, position coordinate data that corresponds to the side is obtained from the boundary condition, such as a contrast, a brightness and the like. Since the detected side is the position coordinate data of a point group which is provided by the resolution of the CCD camera and the boundary condition, it is possible to calculate dimensions of the respective sides from an average square method and the like.

Figure 10:
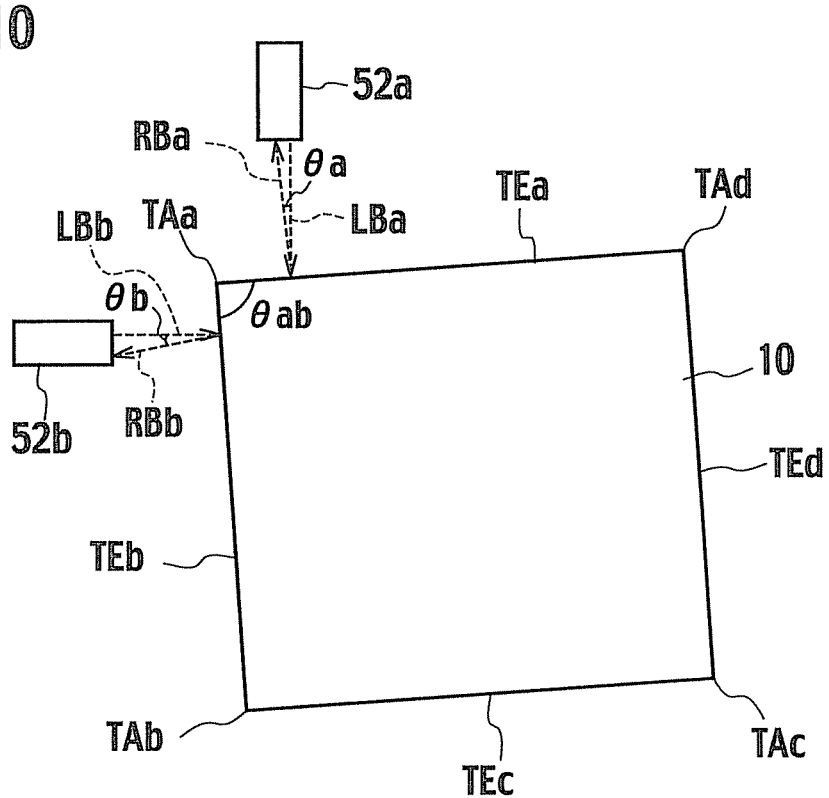
FIGS. 10 and 11 are schematic views showing an example of a method of an angle measurement according to the embodiment of the present invention.

In the angle measurement of the respective apexes of the measuring object 10, a laser auto-collimator may be used. For example, a case of determining the angle between the sides TEa, TEb at the apex TAa will be described. As shown in FIG. 10, an auto-collimator 52a irradiates to a side surface including the side TEa, and an auto-collimator 52b irradiates a side surface including the side TEb. At this time, laser lights LBa, LBb emitted from the auto-collimators 52a, 52b, respectively, are arranged so as to intersect at a predetermined angle, for example, so as to be orthogonal. By obtaining reflection angles $\theta a$, $\theta b$ of respective reflection lights RBa, RBb of the laser lights LBa, LBb, it is possible to calculate an angle $\theta ab$ of the apex TAa in the top surface.

Figure 11:
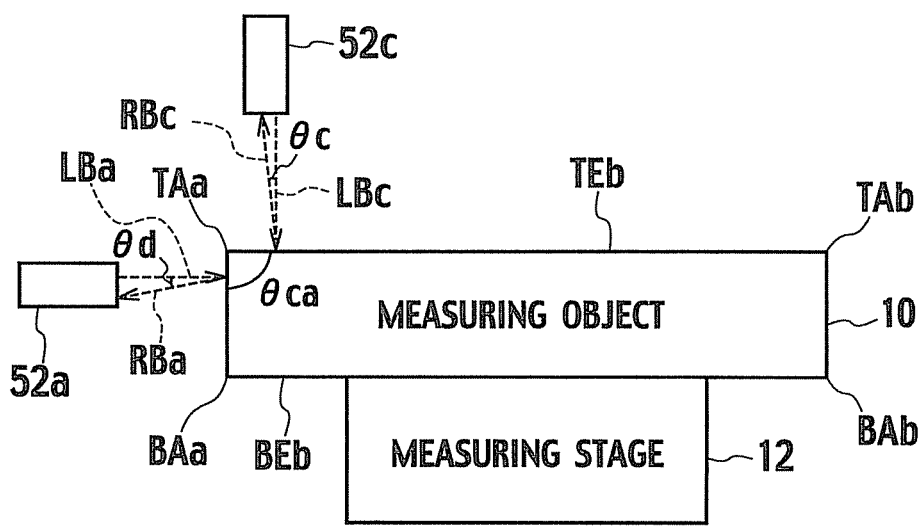

In addition, it is desirable to arrange auto-collimators so as to correspond to all the surfaces forming the respective apexes of the measuring object 10. For example, in order to obtain an angle in two side surfaces including the apex TAa, as shown in FIG. 11, together with the auto-collimators 52a, 52b, an auto-collimator 52c is further arranged such that a laser light LBc of the auto-collimator 52c is orthogonal to the laser lights LBa, LBb. For example, the angle $\theta ca$ between the sides TEb, SEa at the apex TAa of the measuring object 10 is calculated by using reflection angles $\theta d$, $\theta c$ of the reflection lights RBa, RBc of the auto-collimators 52a, 52c.

Also, shapes of reflection spots of the reflection lights RBa, RBb and RBc of the auto-collimators 52a, 52b and 52c are changed due to flatness or parallelism of the irradiated surface. Therefore, by analyzing the reflection spots of the reflection lights RBa, RBb and RBc, it is possible to calculate the flatness and parallelism of the irradiated surface.

Figure 12:
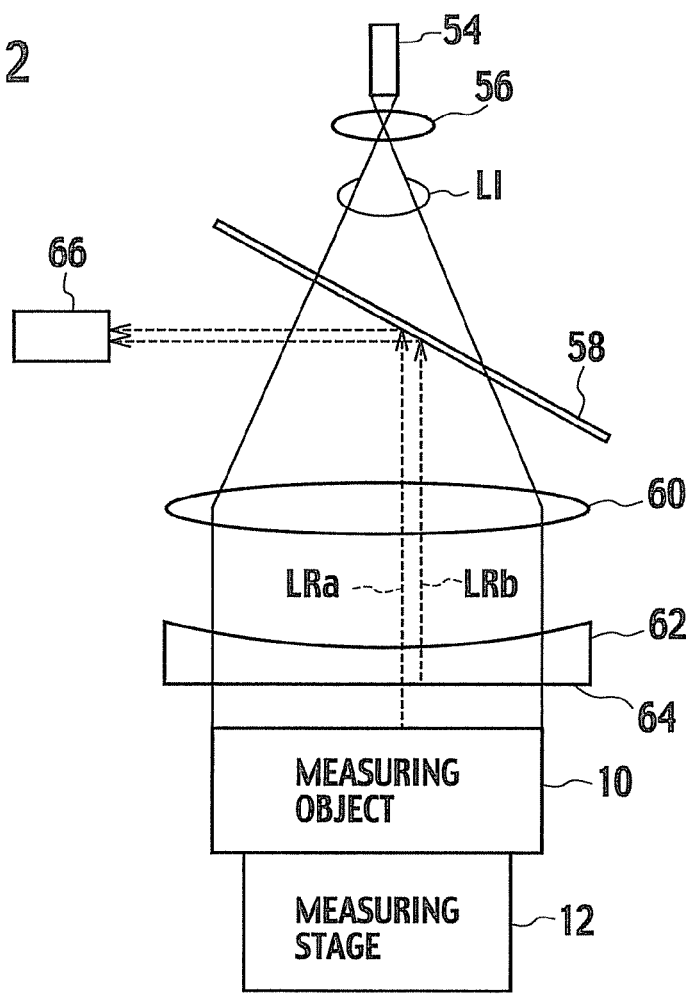
FIG. 12 is a schematic view showing an example of a method of a flatness measurement according to the embodiment of the present invention.

The flatness of each surface of the measuring object 10 may be measured by interference of lights. An interferometer for measuring the flatness includes a light source 54, an illumination lens 56, a reflection plate 58, a collimator lens 60, an objective lens 62 and a detector 66, as shown in FIG. 12. A measurement light LI of the light source 54 is passed through the illumination lens 56, the collimator lens 60 and the objective lens 62, and reflected at the surface of the measuring object 10 on the measuring stage 12. Also, a part of the measurement light LI is reflected on an optical plane 64 formed on the objective lens 62. Reflection lights LRa, LRb from the measuring object 10 and the optical plane 64 are reflected towards the detector 66 by the reflection plate 58. The detector 66 detects an interference image of the reflection lights LRa, LRb. The flatness of the irradiated surface can be calculated from the detected interference image. Note that an interferometer having an oblique illumination system may be used to measure the interference image.

Also, an outer edge of the measuring object 10 can be detected on the basis of brightness change in the interference image of each surface of the measuring object 10. The shape of each surface can be obtained by measuring the position coordinate of the brightness change.

Figure 13:
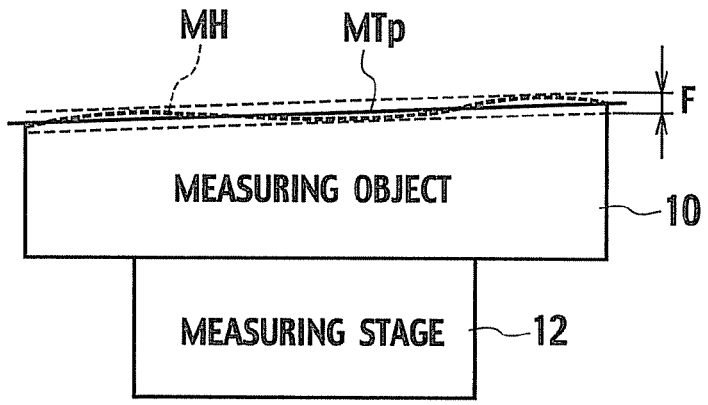
FIG. 13 is a schematic view showing another example of a method of a flatness measurement according to the embodiment of the present invention.

In addition, the flatness can be also calculated by height measurement. For example, the focus position of the laser light LB of the stylus 50 shown in FIG. 6 is measured with the surface of the measuring stage 12 as a reference surface. In this way, coordinate data MH of the height of the surface of the measuring object 10 can be obtained with respect to the reference surface, as shown in FIG. 13. A best fitting plane MTp is determined from the coordinate data MH by using the least squares method and the like. Using the determined plane MTp as a standard, a difference of elevation can be calculated as flatness F. Also, parallelism can be calculated from an inclination of the plane MTp.

According to the embodiment of the present invention, the predicted data of the angle and flatness are calculated from the dimension measurement data as the first shape factor. The dimension measurement data includes a measurement error caused by the measuring tool 14. The error of the dimension of each side can be reduced in accordance with a range in which the figure composed from the dimension measurement data is formed, or the calculated angle and flatness and the like. Also, by using the angle measurement data and the flatness measurement data as the second shape factors together with the dimension measurement data, it is possible to further narrow the range in which the composed figure is formed. Also, the measuring object 10 is measured on the same measuring stage 12 when the first and second shape factors are measured. Thus, it is possible to suppress variation of the measurement data, which is caused by the measuring stage. As a result, it is possible to obtain the measurement shape with high accuracy and high reliability.

For example, the measuring object 10 is assumed to be an imprint mold or an exposure mask. When lithography simulation is implemented using a measurement shape of the measuring object 10, calculation time can be decreased because a range of an error of the measurement shape is reduced.

Figure 14A:
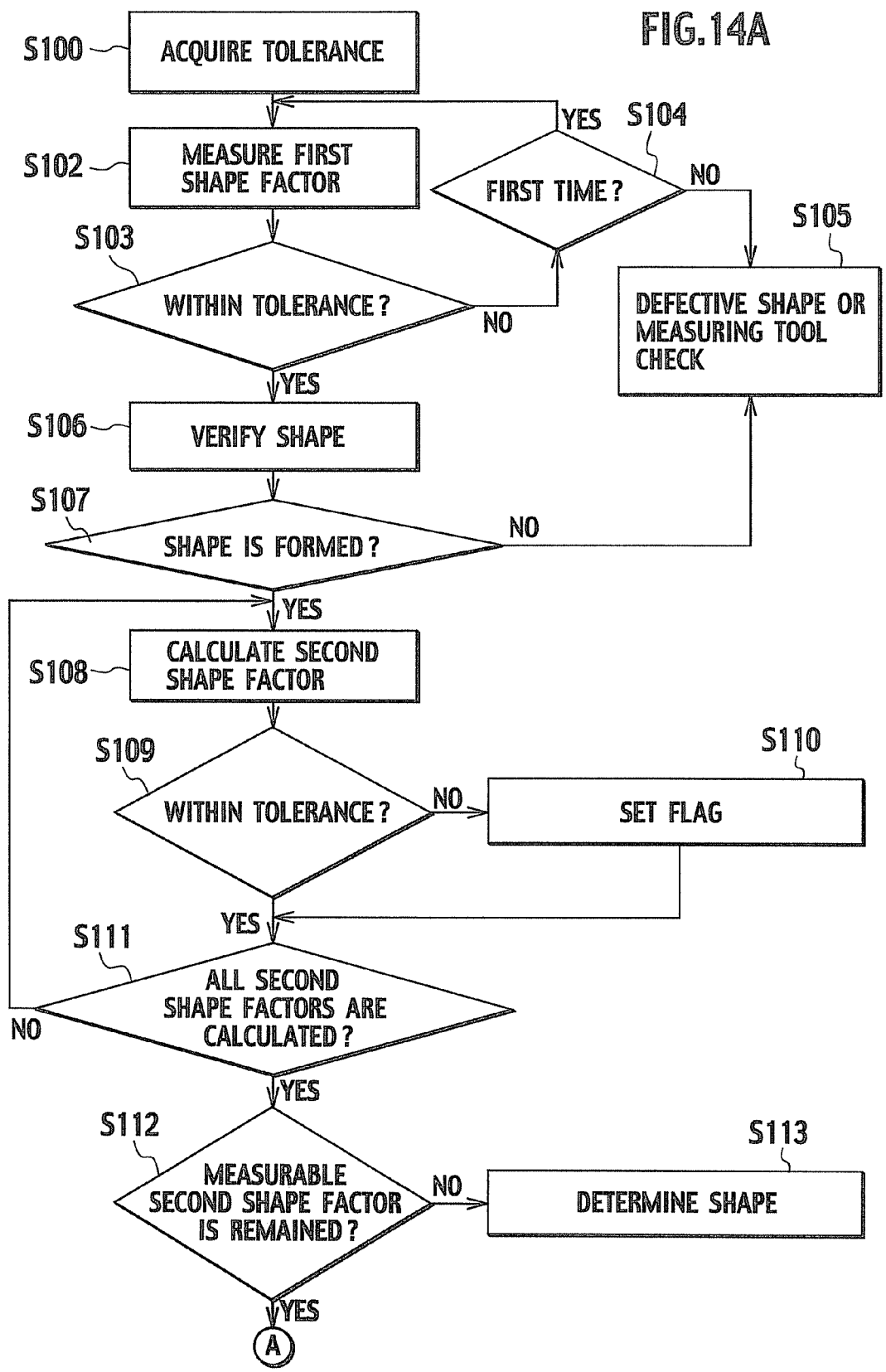
FIGS. 14A and 14B are a flowchart showing an example of a measurement method according to the embodiment of the present invention.
Figure 14B:
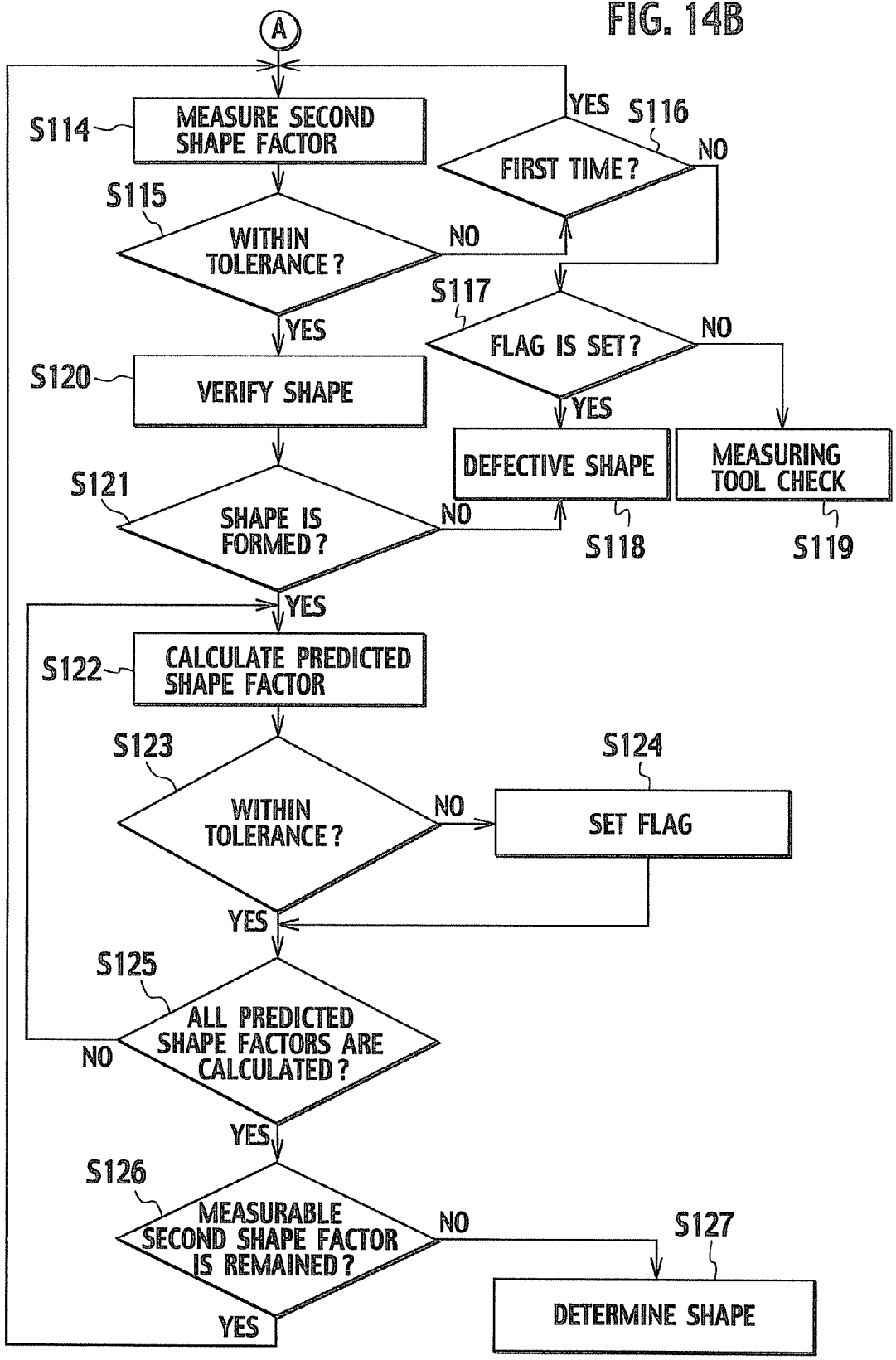

Next, a measuring method according to the embodiment of the present invention will be described with reference to the flowchart shown in FIGS. 14A and 14B. Note that the tolerance of the shape defined in the specification of the design shape of the measuring object 10 is stored in the external storage unit 26 shown in FIG. 1. Dimension measurement, angle measurement and flatness measurement are implemented using the measuring tools 14, 14a, 14b, respectively.

In Step S100, the input module 30 of the measurement processing unit 20 obtains the specification of the design shape of the measuring object 10 from the external storage unit 26.

In Step S102, the measuring tool (first measuring tool) 14 measures dimension (first shape factor) of each side defining the shape of the measuring object 10 on the measuring stage 12. The input module 30 obtains first measurement data of the first shape factor measured by the measuring tool 14.

In Step S103, the comparison module 32 compares the first measurement data with the tolerance of the first shape factor.

If the first measurement data is not within the range of the specification of the design shape, in Step S104, it is determined whether the comparison of the first measurement data is for the first time. If the comparison is for the first time, re-measurement of the first shape factor is implemented. If the comparison is for the second time, in Step S105, the measuring tool 14 is checked. If the measuring tool 14 is normal, the corresponding measuring object is determined to be defective.

If the first measurement data is within the range of the tolerance of the first shape factor, in Step S106, the verification module 34 composes a first predicted shape using the first measurement data. In Step S107, it is verified whether the first predicted shape is formed as a figure. If the first predicted shape is not formed as a figure, in Step S105, determination of defective shape or check of the measuring tool is instructed.

If the first predicted shape is formed as a figure, in Step S108, the calculation module 36 calculates first predicted data of angles (second shape factors) of the respective apexes from the first predicted shape.

In Step S109, the determination module 38 determines whether the first predicted data is within the range of the specification of the design shape. If the first predicted data is not within the range of the specification, in Step S110, a flag indicating that the corresponding second shape factor is outside the range of the specification is set.

In Step S111, the determination module 38 determines whether all of the second shape factors, which are capable of calculating, are calculated. For example, if flatness (second shape factor) is not calculated, the process returns to Step S108.

In Step S112, the determination module 38 determines whether a measurable second shape factor is remained. If there is no measurable second shape factor, in Step S113, the determination module 38 determines the first predicted shape as a measurement shape.

When the angle and the flatness are included as the measurable second shape factors, in Step S114, the measuring tool 14a (second measuring tool) measures intersecting angles (second shape factors) of the respective surfaces from the measuring object 10 on the measuring stage 12. The input module 30 obtains the second measurement data of the second shape factors measured by the measuring tool 14a.

In Step S115, the comparison module 32 compares the second measurement data with the tolerance of the second shape factor.

If the second measurement data is not within the range of the specification of the design shape, in Step S116, it is determined whether the comparison of the second measurement data is for the first time. If the comparison is for the first time, re-measurement of the second shape factor is implemented. If the comparison is for the second time, in Step S117, it is determined whether the flag is set. If the flag is set, in Step S118, it is determined to be defective. If the flag is not set, in Step S119, the measuring tool 14a is checked.

If the second measurement data is within the range of the specification, in Step S120, the verification module 34 composes the second predicted shape using the first and second measurement data. In Step S121, it is verified whether the second predicted shape is formed as a figure. If the second predicted shape is not formed as a figure, in Step S118, it is determined to be defective.

If the second predicted shape is formed as a figure, in Step S122, the calculation module 36 calculates the second predicted data of flatness (predicted shape factor) of each surface from the second predicted shape.

In Step S123, the determination module 38 determines whether the second predicted data is within the range of the specification of the design shape. If the second predicted data is not within the range of the specification, in Step S124, a flag indicating that the predicted shape factor is outside the range of the specification is set.

In Step S125, the determination module 38 determines whether all of the predicted shape factors, which are capable of calculating, are calculated. If there is the predicted shape factor that is not calculated, the process returns to Step S122.

In Step S126, the determination module 38 determines whether a measurable second shape factor is remained. For example, if measurement of flatness is possible, the process returns to Step S114, and the process is continued.

If there is no measurable second shape factor, in Step S127, the determination module 38 determines the second predicted shape as a new measurement shape.

In the measuring method according to the embodiment of the present invention, the first measurement data of the first shape factor includes the measurement error caused by the measuring tool 14. The error of the first measurement data can be reduced on the basis of the range in which the figure composed from the first measurement data is formed, or the predicted data of the second shape factor calculated by using the first measurement data. Also, by using the second measurement data of the second shape factor together with the first measurement data, it is possible to further narrow the range in which the figure composed by using the first and second measurement data is formed. Also, the measuring object 10 is measured on the same measuring stage 12 in the measurement of the first and second shape factors. Therefore, it is possible to suppress variations of the measurement data caused by the measuring stage 12. As a result, it is possible to obtain the measurement shape with high accuracy and high reliability.

In addition, in the above description, the tolerance defined in the specification of the design shape is used for the tolerance of the shape. For example, when each shape factor, such as dimension, angle, flatness and the like, of an imprint mold, an exposure mask and the like is used independently, it is possible to achieve processing accuracy that satisfies the specification of the design shape. However, when specification of the shape is close to the limit of accuracy of a processing technique for outer shape, it is difficult to process so as to satisfy all of the specifications for a plurality of shape factors. In such a case, the tolerance defined in accordance with the correlation between the transfer property of a pattern transferred to a transfer film, such as a resist film, and the shape factor may be used for the tolerance of the shape factor.

The correlation between the transfer property and the shape factor is obtained by implementing lithography simulation using a control parameter of a transfer apparatus, a material parameter of the transfer film and the like, in addition to environment, such as temperature, humidity and the like.

When the transfer apparatus is an exposure tool, an illuminance unevenness of illumination, a numerical aperture (NA), a depth of focus (DOF), a control system of a magnification correction and an astigmatic correction for a reduction optical system, a mask support system, a driving system of a mask stage, a substrate support system, a driving system of a substrate stage, and the like, may be cited for the control parameter. In the case of an imprint tool, a mold support system, a mold pressing system, a driving system of a mold stage, a substrate support system, a driving system of a substrate stage, an illuminance and an illuminance distribution of ultraviolet light in an optical imprint, and a speed of temperature rising or cooling, thermal distribution and the like in a thermal imprint may be cited for the control parameter. For the material parameter of the transfer film, sensibility, resolution and film thickness of a photosensitive resin, such as a photoresist and the like, and contractile rate and elastic modulus of a transfer resin may be cited.

For the transfer property, a dimension error, linearity and image position displacement (IP error) of the transferred pattern may be cited. The dimension error is a difference of a transferred pattern calculated by lithography simulation and the like from the design specification. The shape factors, the control parameters of the transfer apparatus, and the material parameters of the transfer film and the like contribute to the dimension error. The linearity is an index indicating linearity of a relationship between a width of a pattern of the imprint mold or the exposure mask and a width of a corresponding transferred pattern. The linearity is mainly caused by the shape factors and the control parameters of the transfer apparatus. The IP error is an index indicating whether a target pattern is transferred to a target position. The IP error is mainly caused by the shape factors and the control parameters of the transfer apparatus.

For example, in an EUV exposure, a reflection optical system is used, and an exposure mask is supported by contacting a bottom surface on a mask stage. When a pattern of the exposure mask is transferred to a transfer film, such as a resist film and the like, the shape factors, such as flatness, parallelism, and thickness, of the exposure mask, are correlated with the transfer property, especially, with the IP error of the transferred pattern.

The IP error of the transferred pattern is generated by position displacement in a thickness direction of a patterned surface of the exposure mask, inclination of the patterned surface, and the like. Among the shape factors of the exposure mask, flatness and thickness can cause the position displacement of the patterned surface. Also, flatness and parallelism can cause the inclination of the patterned surface. Thus, the flatness is related to both of the position displacement in the thickness direction of the patterned surface of the exposure mask and the inclination of the patterned surface. Therefore, the flatness has strong correlation to the IP error.

The IP error can be modified by adjusting lenses and mirrors in a reduction optical system to implement magnification correction, astigmatic correction and the like. Also, parallelism and thickness of the exposure mask can be adjusted by a driving system of a mask stage for positioning the exposure mask to a proper position with respect to a light source. In other words, with respect to correlation to the IP error, parallelism and thickness have a high degree of an adjustment latitude, and flatness has a low degree of the latitude.

It is possible to calculate a tolerance of the shape factor by lithography simulation to respond to a tolerance of the IP error. Among the calculated shape factors, with respect to the parallelism and the thickness, a value of the tolerance may be reduced as compared with the design specification. In this way, it is effective from an industrial viewpoint of usefulness, productivity and cost to implement defect determination of a shape using a tolerance defined by the correlation between the transfer property of the transferred pattern on the transfer film, such as a resist film and the like, and the shape factor, for a tolerance of the shape factor.

Other Embodiments

The present invention has been described as mentioned above. However the descriptions and drawings that constitute a portion of this disclosure should not be perceived as limiting this invention. Various alternative embodiments and operational techniques will become clear to persons skilled in the art from this disclosure.

In the embodiment of the present invention, the measuring object 10 is placed on the measuring stage 12. It is effective in the case of the measuring object 10, such as an exposure photo mask for ultraviolet, which is supported with a small contact area on a mask stage of an exposure tool. It is possible to obtain a shape of the measuring object 10 which is not affected by an external force. However, it is easily affected by measurement accuracy of the measuring tool 14 and reproducibility of the measurement.

The measuring object 10 may be supported by installing an attachment system, such as a vacuum chuck, an electrostatic chuck, and the like, on the measuring stage 12. It is effective in the case of the measuring object 10, such as an imprint mold, an exposure mask for EUV, and the like, which is attached and fixed with a large area. The measuring object 10 is flattened out with a bottom surface thereof as an attachment surface. Therefore, it is possible to calculate the shape factor by assuming the attachment surface to be a flat surface, and to obtain the shape with high accuracy in a short time because of simple calculation.

Figure 15:
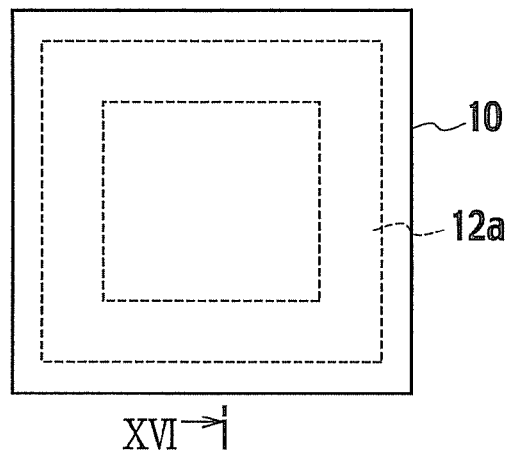
FIG. 15 is a plan view showing another example of a measuring stage according to the embodiment of the present invention.
Figure 16:
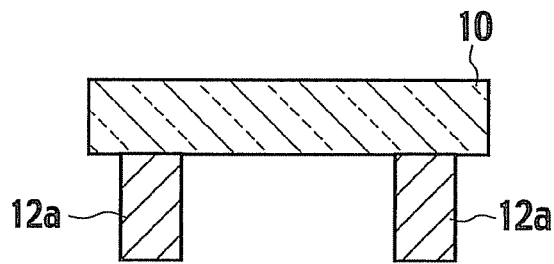
FIG. 16 is a cross sectional view taken on line XVI-XVI of the measuring stage shown in FIG. 15.
Figure 17:
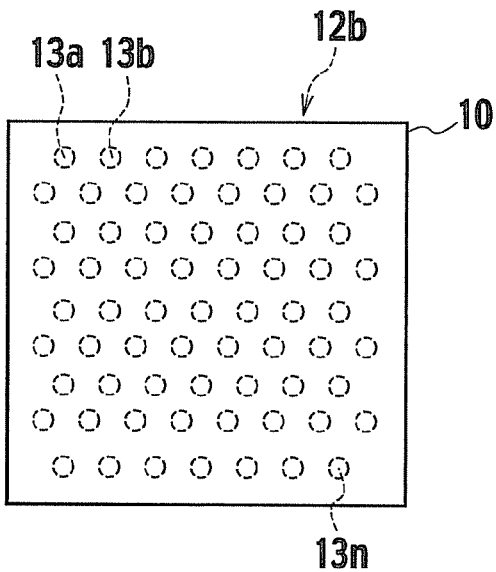
FIGS. 17 to 20 are plan views showing another examples of measuring stages according to the embodiment of the present invention.

Also, an area where the measuring stage 12 supports the measuring object 10 is a rectangular plane surface. However, the structure of the measuring stage 12 supporting the measuring object 10 is not limited. For example, as shown in FIGS. 15 and 16, a measuring stage 12a supporting a region along an outer periphery edge of the measuring object 10 may be used. Moreover, a measuring stage 12b in which a bottom surface of the measuring object 10 is supported by a plurality of support members 13a, 13b, . . . , 13n may be used.

Figure 18:
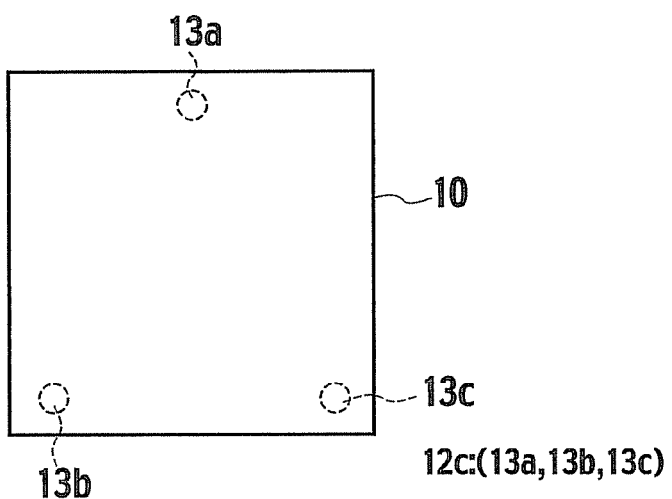
Figure 19:
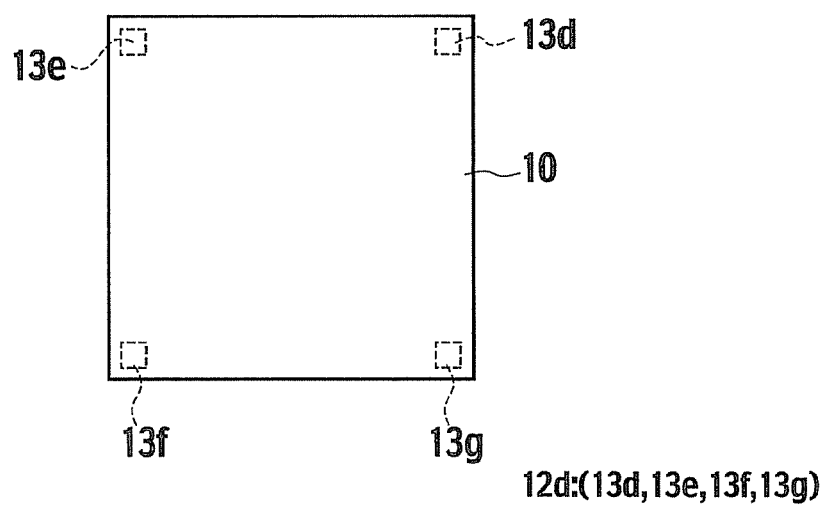
Figure 20:
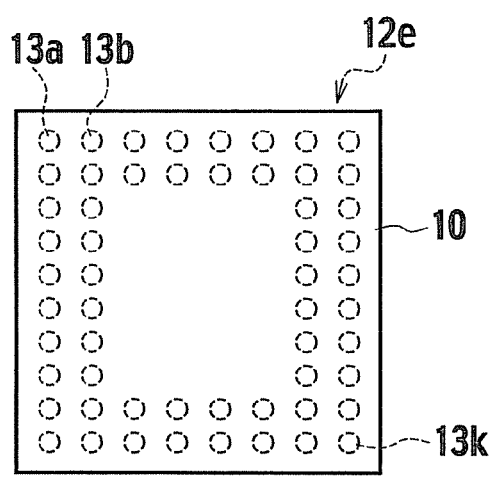

Moreover, as shown in FIG. 18, a measuring stage 12c having a three-point supporting structure supporting a bottom surface of the measuring object 10 by support members 13a, 13b, 13c may be used. Also, as shown in FIG. 19, a measuring stage 12d having a four-point supporting structure supporting by support members 13d, 13e, 13f, 13g may be used. Moreover, as shown in FIG. 20, a measuring stage 12e having a multi-point supporting structure supporting a region along the outer periphery edge of the measuring object 10 by support members 13a, 13, . . . , 13k may be used. In such a point supporting structures, it is easy to identify a portion in contact with the bottom surface of the measuring object 10. Thus, when error occurs in the measurement, influence of the measuring stage may be inherited. In addition, in the case of the point supporting structure, it is desirable to install a detector, such as a load cell, an electrostatic capacitance sensor and the like, on the support members of the measuring stage, in order to identify the supporting portion.

Various modifications will become possible for those skilled in the art after storing the teachings of the present disclosure without departing from the scope thereof.

The invention claimed is:

1. A system for measuring a shape, comprising:
   an external storage unit configured to store tolerances of first and second shape factors, the first and second shape factors defining a design shape of a measuring object;
   a first measuring tool configured to measure the first shape factor of the measuring object by obtaining position coordinates of peripheral edges of the measuring object and to obtain measurement data; and
   a measurement processing unit configured to determine a shape of the measuring object, the measurement processing unit includes;
      a comparison module configured to compare the measurement data of the first shape factor with the tolerance of the first shape factor stored in the external storage unit;
      a verification module configured to compose a predicted shape using the measurement data when the measurement data is in a range of the tolerance of the first shape factors, and to verify whether the predicted shape is formed as a figure corresponding to the design shape;
      a calculation module configured to calculate predicted data of the second shape factor from the predicted shape normally composed by the verification module; and
      a determination module configured to determine a measurement shape by comparing the predicted data calculated by the calculation module with the tolerance of the second shape factor stored in the external storage unit
   wherein the predicted data of the second shape factor reduces an error in the measurement data of the first shape factor.

2. The system of claim 1, further comprising:
   a second measuring tool configured to measure the second shape factor.

3. The system of claim 1, wherein the measuring object is one of an imprint mold and an exposure mask.

4. The system of claim 1, wherein each of the tolerances of the first and second shape factors is a tolerance defined in a specification of the design shape.

5. The system of claim 3, wherein each of the tolerances of the first and second shape factors is a tolerance defined in a specification of the design shape.

6. The system of claim 3, wherein each of the tolerances of the first and second shape factors is a tolerance defined by a correlation with a calculation result of a transfer property of a pattern transferred to a transfer film using the measuring object.

7. The system of claim 1, wherein a surface area of a measuring stage supporting the measuring object is placed medially in a peripheral edge of a supported surface of the measuring object.

8. The system of claim 7, wherein the measuring stage has more than two support members for supporting the measuring object.

9. A non-transitory computer-readable medium encoded with a computer program for causing a computer to measure a shape comprising:
   obtaining first measurement data of a first shape factor measured from a measuring object by obtaining position coordinates of peripheral edges of the measuring object by a first measuring tool using an input module of a measuring process unit of the computer, the first shape factor and a second shape factor defining a design shape of the measuring object;
   comparing the first measurement data with a tolerance of the first shape factor in a comparison module of the measuring unit of the computer, the tolerance of the first shape factor retrieved from an external storage unit of the computer;
   when the first measurement data is within a range of the tolerance of the first shape factor forming a first predicted shape horn the first measurement data and verifying that a first predicted shape is formed as a figure in a verification module of the computer;
   when the first predicted shape is formed as a figure calculating first predicted data of the second shape factor from the first predicted shape using a calculation module of the computer, the second shape factor differing from the first shape factor; and
   when the first predicted data is within a range of a tolerance of the second shape factor determining the first predicted shape as a first measurement shape
   wherein first predicted data of the second shape factor reduces an error in the first measurement data of the first shape factor.

10. The non-transitory computer-readable medium of claim 9, further comprising:
    obtaining second measurement data of the second shape factor measured from the measuring object by a second measuring tool;
    verifying whether a second predicted shape is formed as a figure when the second measurement data is within a range of the tolerance of the second shape factor, the second predicted shape composed using the first and second measurement data;
    calculating second predicted data of a predicted shape factor from the second predicted shape when the second predicted shape is formed as a figure, the predicted shape factor differing from the first and second shape factor; and
    determining the second predicted shape as a second measurement shape when the second predicted data is within a range of a tolerance of the predicted shape factor.

11. The non-transitory computer-readable medium of claim 9, wherein the first shape factor is a dimension of a peripheral edge of the measuring object.

12. The non-transitory computer-readable medium of claim 9, wherein the second shape factor includes at least one of an angle of an apex of the measuring object and a flatness of a surface defined by the peripheral edge.

13. The non-transitory computer-readable medium of claim 9, wherein the measuring object is one of an imprint mold, an exposure mask and a quartz substrate.

14. The non-transitory computer-readable medium of claim 9, wherein each of the tolerances of the first and second shape factors is a tolerance defined in a specification of the design shape, or defined by a correlation with a calculation result of a transfer property of a pattern transferred to a transfer film using the measuring object.

15. The non-transitory computer-readable medium of claim 13, wherein each of the tolerances of the first and second shape factors is a tolerance defined in a specification of the design shape, or defined by a correlation with a calculation result of a transfer property of a pattern transferred to a transfer film using the measuring object.

16. The non-transitory computer-readable medium of claim 9, wherein the measuring object is one of an imprint mold and an exposure mask.

17. The non-transitory computer-readable medium of claim 16, wherein the first shape factor is a flatness of a surface defined by a peripheral edge of the measuring object.

18. The non-transitory computer-readable medium of claim 17, wherein the second shape factor includes at least one of an angle of an apex of the measuring object and a dimension of the peripheral edge.

19. The non-transitory computer-readable medium of claim 16, wherein each of the tolerances of the first and second shape factors is a tolerance defined by a correlation with a calculation result of a transfer property of a pattern transferred to a transfer film using the measuring object.

20. The non-transitory computer-readable medium of claim 10, wherein the first and second shape factors are measured using a measuring stage supporting the measuring object, a surface area of the measuring stage placed medially in a peripheral edge of a supported surface of the measuring object.

21. The non-transitory computer-readable medium of claim 20, wherein the measuring stage has more than two support members for supporting the measuring object.

22. A non-transitory computer-readable medium encoded with a computer program product containing instructions therein for causing a computer processor to measure a shape, comprising:

instructions configured to measure a first shape factor defining a design shape of a measuring object by obtaining position coordinates of peripheral edges of the measuring object;

instructions configured to obtain first measurement data of the measured first shape factor;

instructions configured to verify whether a first predicted shape is formed as a figure corresponding to the design shape when the first measurement data is within a range of a tolerance of the first shape factor, the first predicted shape composed using the first measurement data;

instructions configured to calculate first predicted data of a second shape factor from the first predicted shape when the first predicted shape is formed as a figure the second shape factor differing from the first shape factor; and instructions configured to determine the first predicted shape as a measurement shape when the first predicted data is within a range of a tolerance of the second shape factor, wherein the first predicted data of die second shape factor reduces an error in the measurement data of the first shape factor.

* * * * *